(12) United States Patent
Stites et al.

(10) Patent No.: US 8,845,163 B2
(45) Date of Patent: Sep. 30, 2014

(54) LED-BASED PHOTOLITHOGRAPHIC ILLUMINATOR WITH HIGH COLLECTION EFFICIENCY

(75) Inventors: David G. Stites, St. Petersburg, FL (US); Andrew M. Hawryluk, Los Altos, CA (US)

(73) Assignee: Ultratech, Inc., San Jose, CA (US)

( * ) Notice: Subject to any disclaimer, the term of this patent is extended or adjusted under 35 U.S.C. 154(b) by 308 days.

(21) Appl. No.: 13/588,750

(22) Filed: Aug. 17, 2012

(65) Prior Publication Data

US 2014/0049978 A1  Feb. 20, 2014

(51) Int. Cl.
F21V 5/04  (2006.01)

(52) U.S. Cl.
USPC ........... 362/555; 362/294; 362/509; 362/373; 362/580; 250/493.1

(58) Field of Classification Search
None
See application file for complete search history.

(56) References Cited

U.S. PATENT DOCUMENTS

| | | | | |
|---|---|---|---|---|
| 5,410,434 A * | 4/1995 | Shafer | | 359/858 |
| 6,381,077 B1 * | 4/2002 | Jeong et al. | | 359/726 |
| 6,457,830 B1 | 10/2002 | Choi | | |
| 6,758,579 B2 | 7/2004 | Ishikawa et al. | | |
| 6,813,098 B2 * | 11/2004 | Mercado | | 359/727 |
| 6,863,403 B2 * | 3/2005 | Mercado et al. | | 353/97 |
| 7,016,393 B2 * | 3/2006 | Anikitchev et al. | | 372/101 |
| 7,116,402 B2 | 10/2006 | Gui | | |
| 7,116,496 B1 * | 10/2006 | Mercado | | 359/727 |
| 7,148,953 B2 * | 12/2006 | Mercado | | 355/53 |
| 7,177,099 B2 * | 2/2007 | Mercado et al. | | 359/726 |
| 7,253,882 B2 | 8/2007 | Ozaki et al. | | |
| 7,413,314 B2 | 8/2008 | Kim et al. | | |
| 7,488,101 B2 | 2/2009 | Brukilacchio | | |
| 7,544,923 B1 | 6/2009 | Herloski | | |
| 7,568,956 B1 | 8/2009 | Tseng | | |
| 7,766,507 B2 | 8/2010 | Nakajima | | |
| 7,784,949 B2 | 8/2010 | Yamauchi | | |
| 7,965,378 B2 | 6/2011 | Smirnov et al. | | |
| 7,973,996 B2 | 7/2011 | Shanley | | |
| 2003/0031017 A1 | 2/2003 | Tsuji | | |
| 2003/0185004 A1 | 10/2003 | Vogel | | |
| 2004/0130561 A1 | 7/2004 | Jain | | |
| 2007/0002300 A1 | 1/2007 | Hansen et al. | | |
| 2007/0041199 A1 | 2/2007 | Okada | | |
| 2008/0266668 A1 | 10/2008 | Penn | | |
| 2009/0016059 A1 | 1/2009 | Tonooka | | |
| 2010/0026979 A1 | 2/2010 | Michaloski | | |
| 2010/0265482 A1 | 10/2010 | Schubert et al. | | |
| 2011/0188106 A1 | 8/2011 | Bae et al. | | |
| 2013/0077027 A1 * | 3/2013 | Griffin et al. | | 349/65 |

* cited by examiner

*Primary Examiner* — Ashok Patel
(74) *Attorney, Agent, or Firm* — Opticus IP Law PLLC

(57) ABSTRACT

An LED-based photolithographic illuminator with high collection efficiency is disclosed. The illuminator utilizes an array of LEDs, wherein each LED has an LED die and a heat sink. The LED dies are imaged onto the input end of a homogenizer rod to substantially cover the input end without inclusion of the non-light-emitting heat sink sections of the LED. A microlens array is used to image the LED dies. The collection efficiency of the illuminator is better than 50% and the illumination uniformity at the output end of the light homogenizer is within +/−2%.

13 Claims, 9 Drawing Sheets

LED-BASED PHOTOLITHOGRAPHIC ILLUMINATOR WITH HIGH COLLECTION EFFICIENCY

FIELD

The present disclosure relates generally to photolithography systems, and in particular to an LED-based photolithographic illuminator with high collection efficiency.

BACKGROUND ART

A photolithography system has as its basic components an illuminator with a light source, a patterned reticle, a projection imaging lens and a photosensitive (e.g., photoresist-coated) wafer. The illuminator illuminates the reticle with light from the light source. Light transmitted by or reflected from the reticle is then imaged by the projection imaging lens onto the photosensitive wafer. The photosensitive wafer is then processed to form a pattern on the wafer. The photolithographic exposure process and post-exposure process are repeated with a number of different reticles to form on the wafer a semiconductor structure that defines an integrated circuit.

Illumination systems in lithography tools generally employ Hg lamps as the light source. However, the emission from an Hg lamp is very non-uniform. To obtain the exposure uniformity required for photolithography, the emission from the Hg lamp can be directed through a homogenizer rod. This involves either placing the lamp very close to the homogenizer rod or collecting the emission with lenses and imaging the emission onto the input surface of the homogenizer rod.

The light entering the homogenizer rod bounces between the longitudinal surfaces by total internal reflection, and eventually exits the opposite end. The homogenizer rod length is selected so that that the output is very uniform. The length of the rod is determined by a number of factors, such as the homogenizer cross-sectional area, the angular spread in the light rays traveling through the rod, the number of internal bounces needed, and the uniformity required for the particular application.

Typically, the light must bounce between opposite walls of the rod a minimum of 5 times. The larger the number of bounces between the input and the output, the better the illumination uniformity at the output. The more typical implementation is to use a collecting lens to collect the light from the source and image it onto the input surface of the homogenizer rod.

Unfortunately, Hg arc lamps have short operational lives, typically measured in weeks or months. In addition, they are inefficient, with only a few percent of the input power actually emitted within the desired optical spectrum. Moreover, the disposal of Hg arc lamps is an environmental concern because the Hg must be disposed of carefully and in accordance with regulatory requirements.

Hg lamps are also limited in output power. To increase the throughput of lithography tools, it becomes essential to increase the power emitted from the output face of the homogenizer rod. Because the source size and angular emission are defined by the physical characteristics of the homogenizer rod and by the angular emission (determined by the lens coupling the source to the rod), the source etendue is determined. Increasing the power emitted from the output of the homogenizer rod is equivalent to increasing the source brightness.

Increasing the power of an Hg light source usually comes with the price of increasing the source size. Doubling the output power generally requires doubling the source size. As a result, the effective brightness of the source remains approximately constant and the power density at the wafer plane remains constant.

Consequently, the throughput is generally not improved with these larger lamps because the larger power cannot be relayed to the wafer plane. Decreasing the system etendue while maintaining the amount of emitted power from the mercury lamps has been equally difficult to achieve.

SUMMARY

The present disclosure is directed to an LED-based photolithographic illuminator that has a high collection efficiency, e.g., 50% or greater. This is accomplished in part by creating a virtual array of LED light sources. Here, the term "virtual" does not strictly relate to the concept of a virtual image but rather relates to the fact that real images of the LED die of the LED light source serve as the effective light sources. The illuminator allows one to efficiently couple the emission from an LED array to a homogenizer rod while staying within the required numerical aperture (NA).

By designing and fabricating an appropriate microlens array for coupling an LED array to a homogenizer rod, it becomes possible to create an illuminator with virtual (effective) LED light sources that is a much better match to the projection imaging lens in terms of how much illumination light is actually coupled into the projection imaging lens. In examples, the collection efficiency is greater than 50% of the amount of light emitted by the LED array, while in other examples the collection efficiency is greater than 75%. These illumination efficiencies (also referred to as illumination throughput) are better suited to meeting the increasing need for photolithographic applications that deliver more light to the reticle and ultimately to the wafer plane.

Accordingly, a first aspect of the disclosure is an illuminator for a photolithographic system that comprises along an illuminator axis a light source comprising an array of light-emitting diodes (LEDs) arranged generally in a first plane, with each LED having an LED die that radiates actinic light and having an axis and a first area defined by a dimension $L_D$, wherein the LED die is supported by a non-light-radiating heat sink having a second area defined by a dimension $L_H$, with $L_H > L_D$. The illuminator also has a plurality of microlenses arranged generally in a second plane that is substantially parallel to the first plane, with each microlens having a microlens axis that is generally coaxial with a corresponding one of the LED dies, with each microlens having a magnification between 2× and 20×. The illuminator includes a homogenizer rod having an input end and an output end. Each microlens forms on the input end of the homogenizer rod an image of the corresponding LED die to form an array of LED die images that cover substantially the entire input end, thereby defining a plurality of virtual LED light sources on the input end and an illumination uniformity of within +/−2% at the output end.

Another aspect of the disclosure is an illuminator for a photolithographic system having a projection imaging system with a field size. The illuminator includes a light source comprising an array of light-emitting diodes (LEDs) arranged generally in a first plane, with each LED having an LED die that radiates actinic light with a radiance of 600 mW/mm² and having an axis and a first area defined by the dimension $L_D$, wherein the LED die is supported by a non-light-radiating heat sink having a second area defined by the dimension $L_H$, with $L_H > L_D$. The illuminator has a plurality of microlenses arranged generally in a second plane that is substantially parallel to the first plane, with each microlens having a microlens axis that is generally coaxial with a corresponding one of the LED dies, with each microlens having a magnification M that satisfies $(0.5) \cdot L_H/L_D \leq M \leq (1.1) \cdot L_H/L_D$. The illuminator includes a homogenizer rod having an input end and an output end, wherein the output end substantially matches the field size of the projection imaging system. Each microlens forms on the input end of the homogenizer rod an image of the corresponding LED die to form an array of LED die images that cover substantially the entire input end, thereby defining a plurality of virtual LED light sources on the input end and an illumination uniformity of within +/−2% at the output end. The illuminator also has a collection efficiency of greater than 50%.

Additional features and advantages of the disclosure are set forth in the detailed description that follows, and in part will be readily apparent to those skilled in the art from that description or recognized by practicing the disclosure as described herein, including the detailed description that follows, the claims and the appended drawings. The claims are incorporated into and constitute a part of the detailed description of the disclosure.

It is to be understood that both the foregoing general description and the following detailed description present embodiments of the disclosure and are intended to provide an overview or framework for understanding the nature and character of the disclosure as it is claimed.

BRIEF DESCRIPTION OF THE DRAWINGS

The accompanying drawings are included to provide a further understanding of the disclosure and are incorporated into and constitute a part of this specification. The drawings illustrate various embodiments of the disclosure and together with the description serve to explain the principles and operations of the disclosure.

DETAILED DESCRIPTION

Reference is now made in detail to the present preferred embodiments of the disclosure, examples of which are illustrated in the accompanying drawings. Whenever possible, the same reference numbers and symbols are used throughout the drawings to refer to the same or like parts.

U.S. patent application Ser. No. 12/462,678, entitled "Illuminator for a photolithography system," is incorporated by reference herein.

The claims as set forth below are incorporated into and constitute a part of this Detailed Description.

The disclosure is directed to an LED-based photolithographic illuminator that employs a microlens array. An example photolithography system is first described, followed by a detailed description of an example illuminator that is suitable for use in the example photolithography system.

Photolithography System

An example embodiment of the disclosure is a photolithography system that uses the illuminator of the present disclosure. Example photolithography systems in which the illuminator disclosed herein can be adapted for use are described in U.S. Pat. Nos. 7,177,099; 7,148,953; 7,116,496; 6,863,403; 6,813,098; 6,381,077; and 5,410,434, which patents are incorporated by reference herein.

Figure 1:
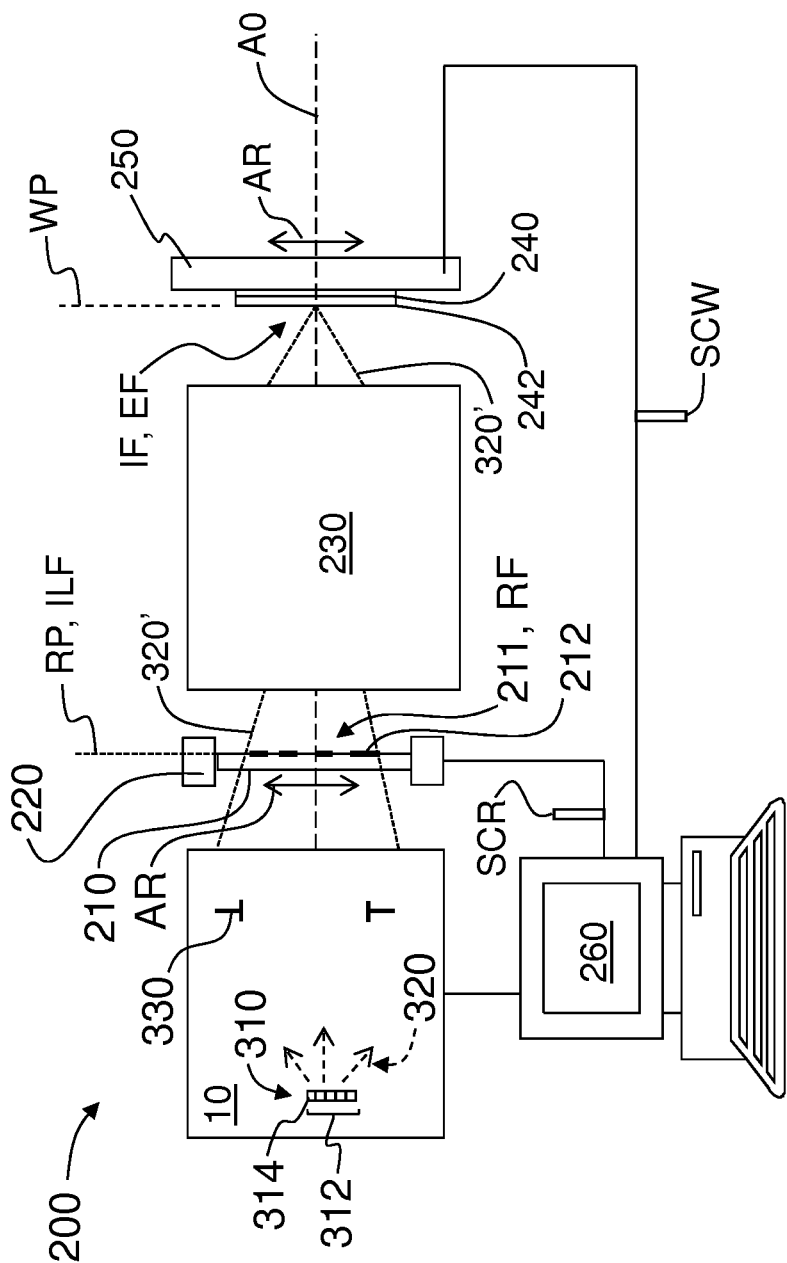
FIG. 1 is a schematic diagram of an example UV lithography system in which the illuminator of the present disclosure is suitable for use.

FIG. 1 is a schematic diagram of an example photolithography system 200 in which the LED illuminator disclosed herein is suitable for use. The photolithography system 200 includes, in order along an optical axis A0, an LED-based illuminator ("illuminator") 10 as described in greater detail below, a reticle 210 (e.g., a patterned mask) supported by a reticle stage 220 at a reticle plane RP, a projection imaging lens 230, and a wafer 240 supported by a wafer stage 250 at a wafer plane WP. The reticle 210 includes a patterned region 211 that includes pattern elements 212 and that defines a reticle field RF. The wafer 240 includes an outer edge 241 (see FIG. 3).

The wafer 240 includes a photosensitive coating 242 (e.g., photoresist) on the wafer surface that is activated by light (i.e., "actinic light") 320 generated by a light source 310 located in illuminator 10. In an example, light source 310 is constituted by an array 314 of LEDs 312. The actinic light 320 can be in the UV and DUV wavelength ranges typically associated with photolithography. In an example, actinic light 320 has a wavelength between 360 nm and 450 nm. Illuminator 10 is shown as included an aperture stop 330.

The photolithography system 200 also includes a controller 260 operably connected to illuminator 10, reticle stage 220 and wafer stage 250. The controller 260 is configured to control the operation of photolithography system 200. An example controller 260 includes a computer such as a personal computer or workstation. In an example, controller 260 includes apparatus-control software that includes instructions, embodied in a computer-readable medium, that control the various components of photolithography system 200.

The illuminator 10 is configured to generate an illumination field ILF (see FIG. 1 and FIG. 2A) at an illumination plane that corresponds to reticle plane RP. The illumination field ILF includes uniformized actinic light 320' and illuminates at least a portion of reticle field RF over a reticle field exposure time so that projection imaging lens 230 forms a corresponding image field IF at wafer plane WP over a corresponding wafer exposure time. The wafer stage 250 is movable (e.g., via a control signal SCW from controller 260) so that image field IF can be placed at different parts of wafer 240 to form various exposure fields EF on the wafer and in particular in photoresist 242. In an example, reticle stage 220 is movable via a control signal SCR from controller 260.

Figure 2B:
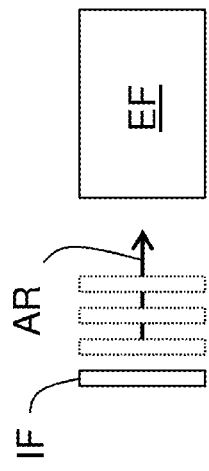
FIG. 2B is a schematic diagram of an example scanning illumination field and an example exposure field associated with the scanned illumination field.
Figure 2D:
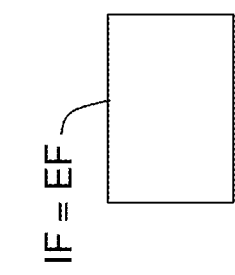
FIG. 2D is similar to FIG. 2B and illustrates an example of a full-field image field that corresponds in size to the corresponding exposure field.
Figure 2A:
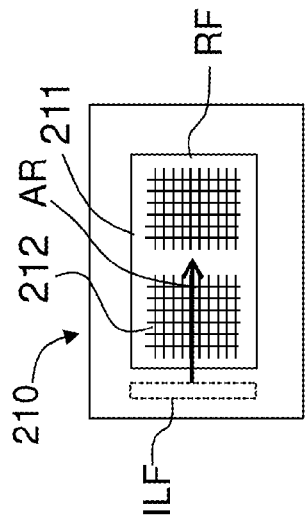
FIG. 2A is a schematic front-on view of an example reticle showing the reticle pattern that defines the reticle field and also showing an example of a scanned illumination field.

Thus, uniformized actinic light 320' from illuminator 10 is used to illuminate at least a portion of patterned region 211 that defines reticle field RF. The illuminated portion of reticle field RF is then imaged onto photosensitive coating 242 of wafer 240 via projection imaging lens 230. In an example embodiment, reticle 210 and wafer 240 are moved together in a manner that scans image field IF over the wafer as illumination field ILF scans over reticle field RF, as illustrated by arrows AR in FIG. 1 and also as schematically illustrated in FIGS. 2A and 2B. This operation forms a scanned exposure field EF that is larger than either illumination field ILF or image field IF. This process is then repeated for a different (unexposed) region of wafer 240. This printing approach is referred to in the art as "step and scan."

Figure 2C:
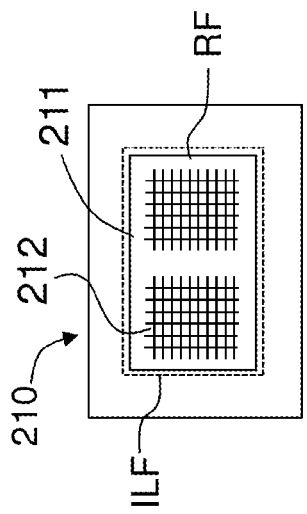
FIG. 2C is similar to FIG. 2A and illustrates an example of a full-field illumination field.

In another example, illumination field ILF illuminates the entire reticle field RF at once, thereby forming, in a single exposure, one exposure field EF. The wafer 240 is then moved, and the single static exposure is repeated. This printing approach is called "step and repeat." FIG. 2C is similar to FIG. 2A and illustrates an example of a full-field illumination field ILF used for step-and-repeat printing. FIG. 2D is similar to FIG. 2B and illustrates an example of a full-field image field IF that corresponds in size to the corresponding exposure field EF as used in step-and-repeat printing.

Figure 3:
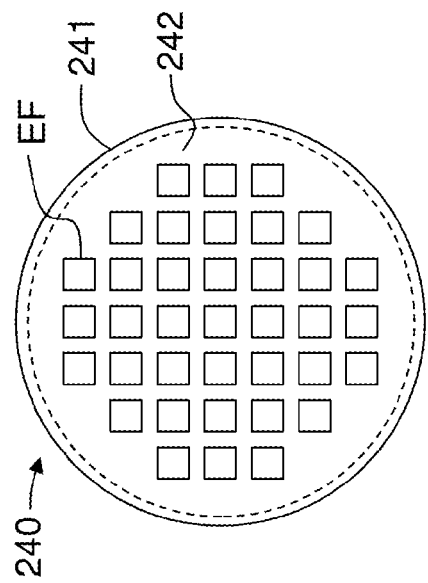
FIG. 3 is a plan view of a semiconductor wafer with exposure fields formed thereon by the photolithography system of FIG. 1.

With reference to FIG. 3, exposure fields EF formed on wafer 240 in photoresist 242 are in turn used to form integrated circuit chips via standard photolithographic and semiconductor processing techniques.

LED-Based Illuminator

There are a number of important design considerations for illuminator 10. The collected emission from array 314 of LEDs 312 must be matched to the etendue of projection imaging lens 230 used in photolithography system 200. The etendue is the product of the source size (mm$^2$) and solid angle (steradians) and has units of mm$^2$-steradians. This product is inversely related to the "brightness" of the source (watts/mm$^2$-steradians). The etendue is conserved throughout an optical system. Thus, for a given source size, the amount of angular emission of actinic light 320 collected by an optical system is determined by the etendue of the optical system. One cannot make a source brighter by decreasing the etendue through the use of conventional lenses or mirrors. While the size of the light source can be magnified or demagnified through the use of optics and one can change the source size and solid angle inversely, the etendue will remain constant.

When one utilizes an Hg arc-lamp light source used with a homogenizer rod for a photolithographic illuminator, the image of the arc lamp is projected onto the input surface of the homogenizer rod. The arc-lamp image can be either magnified or demagnified with a collection lens to change its size at the input end of the homogenizer rod. If the collection lens has a numerical aperture of NA, and it creates a magnified image of the arc lamp at the input to the homogenizer rod at a magnification of M, then the numerical aperture at the input end of the homogenizer rod is given by NA/M. A rectangular homogenizer rod preserves the angles of the rays passing through it. Therefore, the etendue of the illumination system can be calculated from the solid angle of the input end of the homogenizer rod (determined by NA/M) and the output area (or input area) of the homogenizer rod (assuming a cylindrical rod).

If the etendue of such an illuminator is larger than the etendue of projection imaging lens 230 of photolithography system 200, then there is an illumination mismatch wherein the photolithography system cannot use all the light from the illuminator. The etendue of the light source will have to be reduced either by reducing the light source NA (i.e., the angular emission or collection lens NA) or by reducing the area of the homogenizer rod. This will result in less light available for the lithography system.

To increase the illumination throughput of photolithography system 200 (i.e., the amount of light 320 that makes it from the light source to the wafer), it becomes essential to increase the power emitted from the output face of the homogenizer rod. Because the allowed size and angular emission of the light source are defined by the physical characteristics of the homogenizer rod and the angular emission (as determined by the lens that couples the light source to the rod), which set the source etendue. Increasing the power emitted from the output of the homogenizer rod is equivalent to increasing the source brightness.

As discussed above, increasing the power in Hg lamps usually requires increasing the source size. Doubling the output power requires doubling the source size. As a result, the effective brightness of the source remains approximately constant and the power density at the wafer plane remains constant. Consequently, throughput is generally not improved with these kinds of larger lamps. The larger power cannot be relayed to the wafer plane and cannot be converted into higher throughput.

Thus, the light source needs appropriate brightness (i.e., the etendue must be matched), must have sufficient total power, and must meet reliability and operability requirements in order for the light source to be best suited for photolithographic applications.

The light source 310 as disclosed herein includes the aforementioned array 314 of LEDs 312. LEDs are becoming increasingly efficient, and they continue to have improved performance as LED technology develops. During the past decade, the efficiency of LEDs (in terms of emission-power/input-power) has increased 10-fold and is expected to increase another 2× to 4× within the next 5 years. As the efficiency of LEDs increases, so, too, does their brightness. LEDs are now approaching emissions of 1 watt/mm$^2$ for UV-LEDs, and emissions are higher for visible LEDs. As a result of the improvements in LED efficiencies, the brightness of an LED (watts/cm$^2$-steradian) is now as large or larger than the brightness available from a conventional mercury arc lamp. In addition, LEDs do not have any environmentally dangerous materials (such as Hg) and they are more electrically efficient than an Hg arc lamp.

Yet, LEDs are still somewhat inefficient. For every watt of LED power emitted, several watts must be dissipated through heat. Currently, LEDs are approximately 10%-30% efficient, but they are getting more efficient. While it is expected that LEDs will become >30% efficient, it is anticipated that there will be an ongoing need to thermally manage their operation.

Figure 4A:
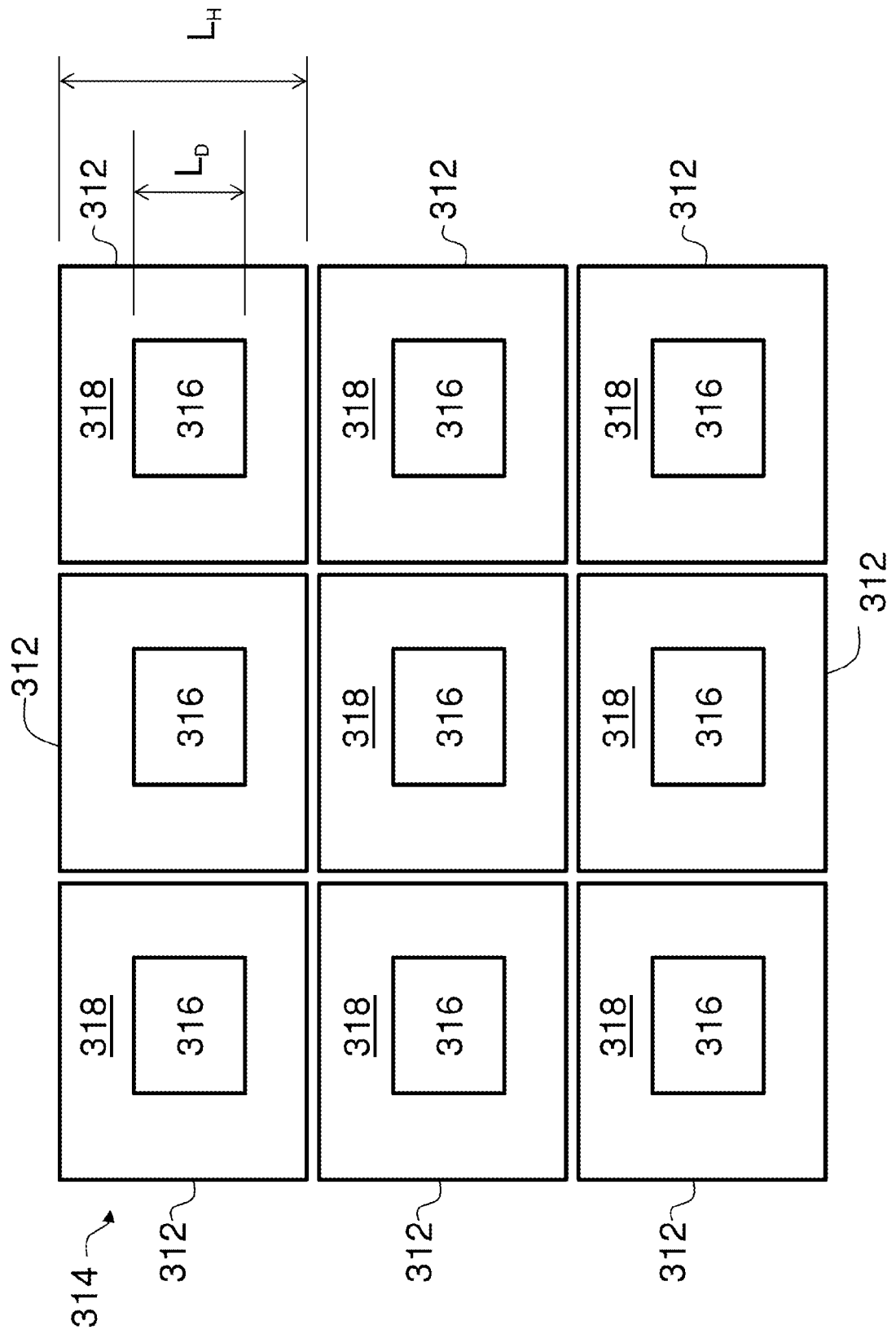
FIGS. 4A and 4B are front-on and side views, respectively, of an example LED array, illustrating how the LED dies are spaced apart by the non-radiation areas of the LEDs associated with the heat sinks required for each LED die.
Figure 4B:
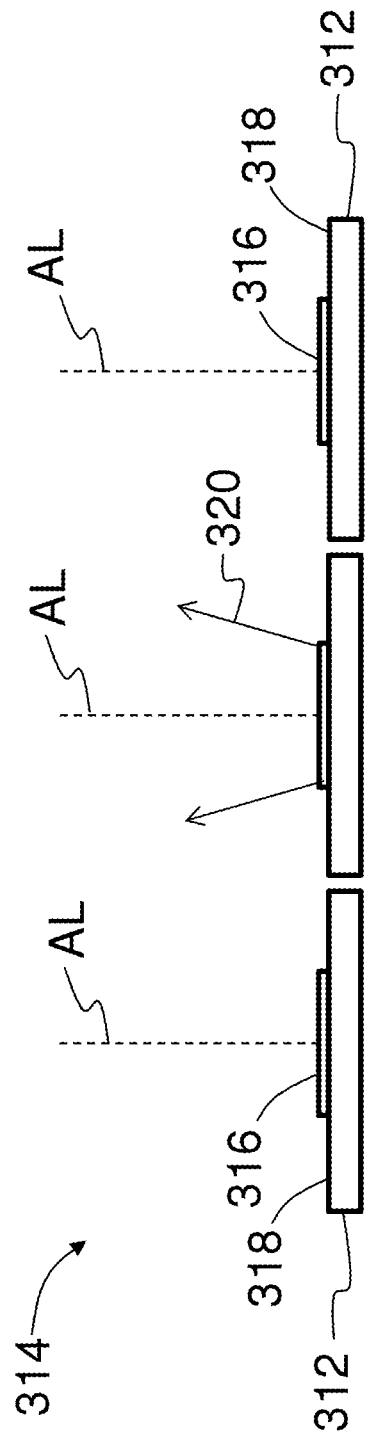

FIG. 4A is a front-on view and FIG. 4B is a side view of an example array 314 of LEDs 312. Each LED 312 includes an LED die 316 mounted to a heat sink 318. The LED dies 316 have a dimension $L_D$ while heat sinks 318 have a dimension $L_H$. Both LED dies 316 and heat sinks 318 are assumed to be square in the present example. In an example, dimension $L_D$ is in the range from 1 mm to 3 mm nominal, while dimension $L_H$ is in the range from 5 mm to 10 mm nominal. Each LED die 316 includes an emission axis AL generally centered on the emission pattern of actinic light 320 (see FIG. 4B). In an example, each LED 312 in LED array 314 emits with a radiance of greater than 600 mW/mm$^2$.

The heat sink 318 is needed to remove excess heat from the corresponding LED die 316. Placing LED dies 316 immediately adjacent one another would create a much higher (local) thermal load (watts/cm2), which would lead to an increased temperature for the LED junction. Higher LED junction temperatures are undesirable because they lead to reduced emission, wavelength shifts and shorter LED lifetimes. Hence, heat sinks 318 must be used, because in addition to dissipating heat, they also serve to keep individual LED dies 316 in array 314 sufficiently far apart, thereby reducing the adverse effects of LED die heating from neighboring LEDs.

The relatively large size of heat sinks 318 relative to the size of LED dies 316 makes it highly problematic if not impossible to place the individual dies close together, which is desirable for forming a high-brightness, high-power LED light source 310 suitable for photolithography system 200. Simply placing LEDs 312 close together (within their housing) produces a light source that emits no radiation in gaps between the LED dies. The heat sinks 318 are designed to distribute the heat generated in the area of LED dies 316. The heat sinks 318 are typically made of high thermal-conductivity material, such as copper or a conductive ceramic.

Consequently, heat sinks 318 have no semiconductor properties and so cannot be made to emit light at the actinic wavelength. That is to say, they are non-radiating. Hence, light source 310 as formed by array 314 of LEDs 312 has an average brightness that is reduced by the fractional area of non-radiating heat sinks 318. This means that light 320 from source 310 is inherently non-uniform because the light source has regions of high emission (LED dies 316), surrounded by regions with zero emission (heat-sinks 318). This type of light source 310 is difficult to efficiently couple to a homogenizer. While the brightness and power emitted by individual LEDs 312 may be high, the average brightness and power for light source 310, which are determined by the ratio of the light-emitting area divided by the non-light-emitting area, are considerably reduced.

Coupling light source 310 directly to a homogenizer rod by placing the light source immediately adjacent the homogenizer rod end is problematic. The rectangular homogenizer rod maintains the angular spectrum of the light emitted by light source 310. Specifically, the input-end NA is the same as the output-end NA of the homogenizer rod. The purpose of a homogenizer rod is to receive at its input end light from a non-uniform source and to internally reflect that light in order to create a uniform emission area at its output end.

While the output of a homogenizer rod at its output end may be uniform, the emission angles can be very high. For a projection imaging lens 230 having a relatively low NA (i.e., less than 0.5), the angular output from the homogenizer rod is so high that many of the light rays exiting the output end of the homogenizer rod will fall within the projection imaging lens NA. Furthermore, many of the very high angle rays are not captured by total internal reflection within the homogenizer rod and so exit the side of the rod and are lost (i.e., they go uncollected).

It is possible to more closely match illuminator 10 and projection imaging lens NAs by magnifying the source emission with a single lens disposed between die array 314 and the input of the homogenizer rod. However, this will require increasing the size of both the input and output ends of the homogenizer rod. Since the output end of the homogenizer rod determines the source size, the etendue requirement of the projection imaging system imposes constraints on the source size.

One approach to addressing the NA mismatch problem is to use a collection lens between LED light source 310 and a homogenizer rod so that LED array 314 is magnified onto the input end of the homogenizer rod. Unfortunately, because of the large radiating area associated with heat sinks 318, the image of LED array 314 at the input end of the homogenizer rod is very large. This requires that the homogenizer rod be equally as large. For example, if LED dies 316 are 2 mm×2 mm on a 6 mm pitch (i.e., $L_H$=6 mm), then for a 3×3 LED array 314, the size of LED source array 314 is 14 mm×14 mm.

A typical collection lens may have an NA=0.9 and magnify the 3×3 array 314 when imaging the source to the homogenizer rod input end. Under these conditions, the homogenizer rod must be at least 42 mm×42 mm in size. The NA of light 320 incident upon the input end of the homogenizer rod and, hence, exiting the rod, is 0.9/3=0.3. The etendue is approximately (NA)$^2$(area)=159 mm$^2$–NA$^2$. The etendue of a projection imaging lens (e.g., the Ultratech AP-300; NA=0.16; 884 mm$^2$) is 23 mm$^2$–NA$^2$. This is a huge mismatch, with only about 14% of light 320 from light source 310 being collected by projection imaging lens 230. Nearly 86% of light 320 from light source 310 would fall outside the collection ability of projection imaging lens 230.

Figure 5A:
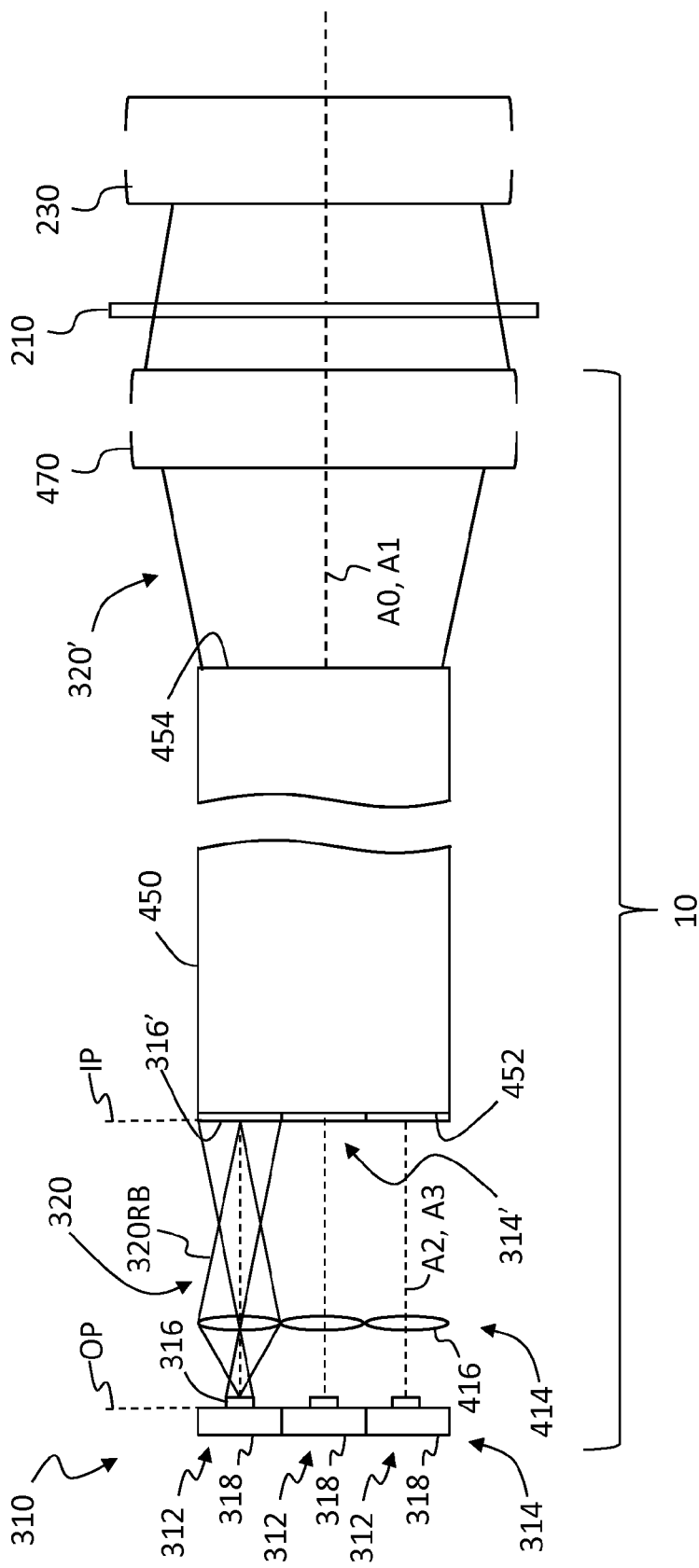
FIG. 5A is a schematic diagram that illustrates an example embodiment of an example illuminator according to the disclosure wherein the homogenizer rod is cylindrical.

FIG. 5A is a cross-sectional view of an example illuminator 10 according to the disclosure. The illuminator 10 has an optical axis A1 along which is arranged light source 310, which includes LED array 314 (e.g., such as shown in FIG. 4A), and a homogenizer rod 450 that has input and output ends 452 and 454. A microlens array 414 resides along axis A1 between light source 310 and input end 452 of homogenizer rod 450. The microlens array 414 includes multiple microlens elements (microlenses) 416, each having a microlens axis A3, an object plane OP and an image plane IP. The LED array 314 resides generally at object plane OP while input end 452 of homogenizer rod 450 resides generally at image plane IP.

Figure 5B:
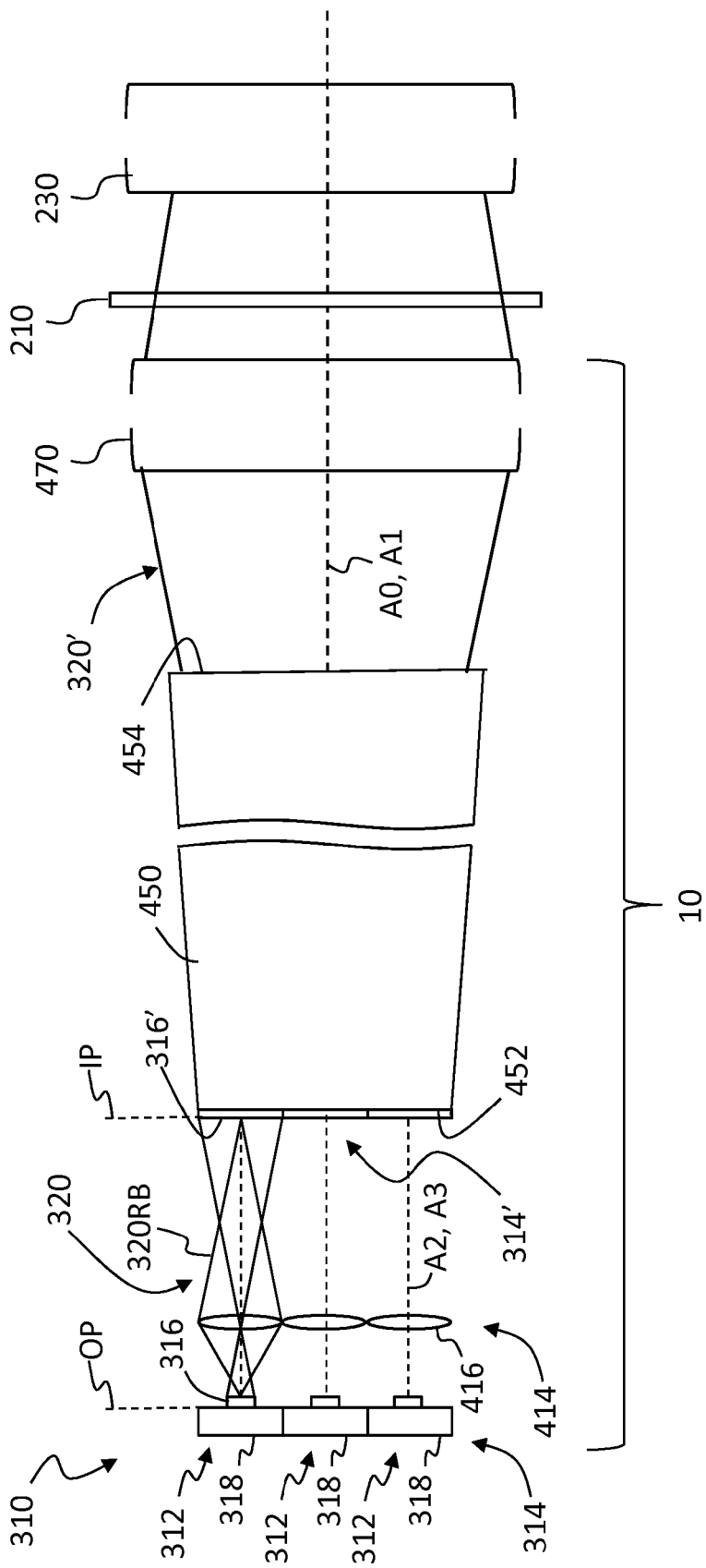
FIG. 5B is similar to FIG. 5A and illustrates an example embodiment wherein the homogenizer rod is tapered, with the area of the output end being greater than the area of the input end.

The homogenizer rod 450 is shown in FIG. 5A as being cylindrical, i.e., the cross-sectional area is constant as a function of length. FIG. 5B is similar to FIG. 5A and illustrates an example embodiment wherein the homogenizer rod 450 is tapered, where the increase in size is from input end 452 to output end 454, so that the area of the output end is greater than the area of the input end. However, the homogenizer rod can be rectangular in its cross sectional area.

The illuminator 10 also includes a relay optical system 470 adjacent output end 454 of homogenizer rod 450. The relay optical system 470 serves to image output end 454 onto reticle 210 while also being configured to work in conjunction with projection imaging lens 230 to define a desired pupil fill.

Each microlens 416 is operably disposed relative to a corresponding LED 314, with microlens axis A3 being substantially coaxial with LED die axis A2. The microlenses 416 are configured to capture as much of the LED emission of light 320 as possible, and so can have a collection NA of up to about 1. Example materials for microlenses 416 include fused silica and quartz, which have good optical transmission at UV wavelengths.

Each microlens 416 is configured to form an image 316' of the corresponding LED die 316. Light rays for light 320 are shown for one microlens-LED pair. The converging ray bundle is denoted 320RB and defines the image-side NA of microlens 416, whose NA corresponds to the input-side NA of homogenizer rod 450.

Figure 7C:
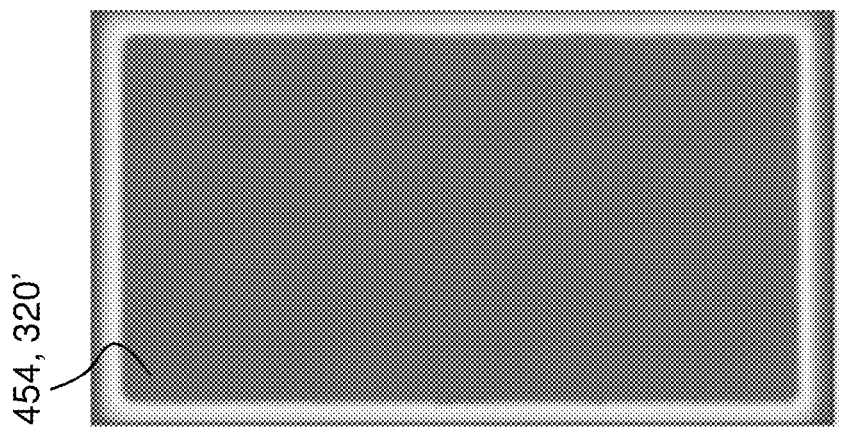
FIG. 7C is a computer simulation of the output end of the homogenizer rod.
Figure 7B:
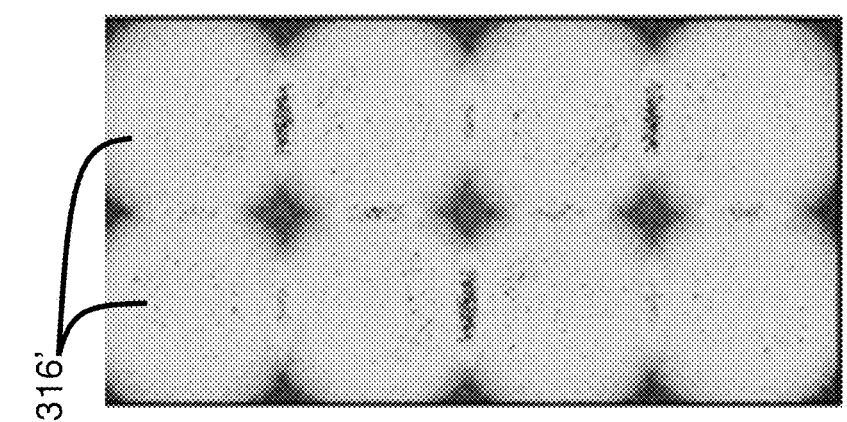
FIG. 7B is a computer simulation of the images of the LED dies as formed on the input end of a homogenizer rod.
Figure 7A:
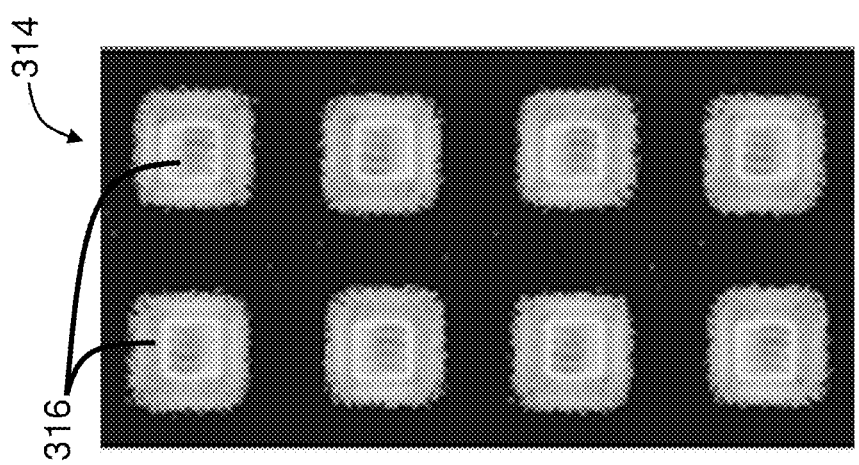
FIG. 7A is a computer simulation of the emission of light from a 2×4 LED array.

In an example, the magnification M of microlens 416 is defined by a magnification $M=L_H/L_D$. The magnification M can be different from $L_H/L_D$ if the lithography tool so requires. For example, if LED die 316 has a dimension $L_D=2$ mm, and heat sink 318 has a dimension $L_H=6$ mm, then the maximum magnification ratio $R=3$, and the microlenses 416 create a virtual source array 314' of LED die images 316' that is now 6 mm×6 mm with no space in between adjacent die images. In other words, the non-radiating portion of LED array 314 associated with heat sinks 318 is not included in the imaging by microlenses 416 so that input end 452 of homogenizer rod 450 has substantially no gaps in the illumination (i.e., the input images 316' of FIG. 7B are considered not to have substantial gaps, whereas the images of FIG. 7A have substantial gaps; FIGS. 7A and 7B are introduced and discussed below). This imaging process creates a virtual array 314' of LED dies 316' that are magnified and that reside on input end 452. In an example, each microlens 416 has a magnification between 2× and 20×.

In an example, magnification M of microlens 416 is $(0.5) \cdot L_H/L_D \leq M \leq (1.1) \cdot L_H/L_D$. The upper limit on this range allows for a slight overfill of input end 452 of homogenizer rod 450, with a larger overfill reducing the overall collection efficiency of illuminator 10. The lower limit on this range allows for underfilling input end 452, which does not reduce the collection efficiency but may require a longer homogenizer rod 450 as compared to the case wherein the input end is just filled.

The virtual array 316' is now much more uniform in both spatial and angular emission than LED array 314 and can conveniently be coupled directly into a homogenizer rod. The size of input end 452 of homogenizer rod 450 for the above example is now 18 mm×18 mm. The NA of ray bundle 320RB entering homogenizer rod 450 is reduced by the magnification ratio R. For example, if microlens 416 has an NA of 0.9, then ray bundle 320RB incident upon input end 452 of homogenizer rod 450 has an NA of 0.3, which also corresponds to the output NA of the homogenizer rod. This NA is sufficiently small that homogenizer rod 450 captures all light 320. In addition, substantially all light 320 is totally internally reflected within homogenizer rod 450 so that there is substantially no loss of light through the walls of the homogenizer rod. In an example, input end 452 of homogenizer rod 450 is sized to have an area substantially equal to the area of virtual array 316'.

The etendue of example illuminator 10 as defined by LED array 314, microlenses 416 and homogenizer rod 450 using the above numbers is 29 mm²–NA². This matches the etendue of a typical lithography system quite well. For example, example illuminator 10 has an etendue that overfills projection imaging lens 230 by only 20% so that 80% of light 320 from light source 310 can be utilized by the imaging system, as opposed to the 14% that is normally utilized when a conventional imaging approach is used.

Figure 6:
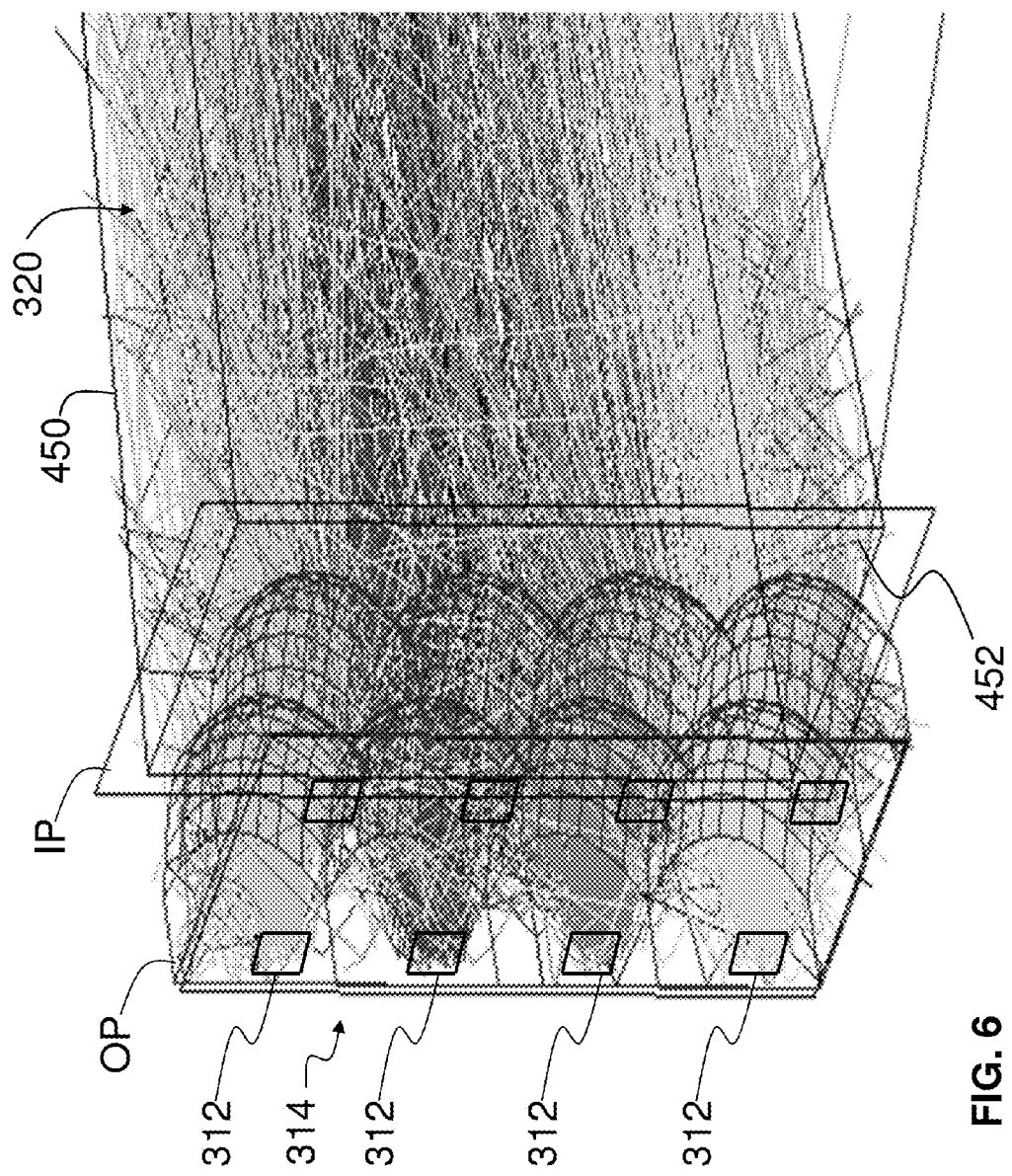
FIG. 6 is a ray-trace simulation showing the light rays associated with eight LEDs and a rectangular homogenizer rod.

FIG. 6 is an elevated view of a ray-trace simulation, performed using ZEEMAX lens design software, of LED array 314 with eight LEDs 312, each coupled to a corresponding microlens 416 as shown in FIG. 5A. FIG. 6 shows input end 452 of light homogenizer 450 and four of the eight LEDs 312.

FIG. 7A is a simulated image of the light emission from the 2×4 LED array 314, while FIG. 7B is the simulated light distribution at input end 452 of homogenizer rod 450. FIG. 7C shows the calculated irradiance at the output end of homogenizer rod 450, illustrating excellent illumination uniformity.

Figure 8:
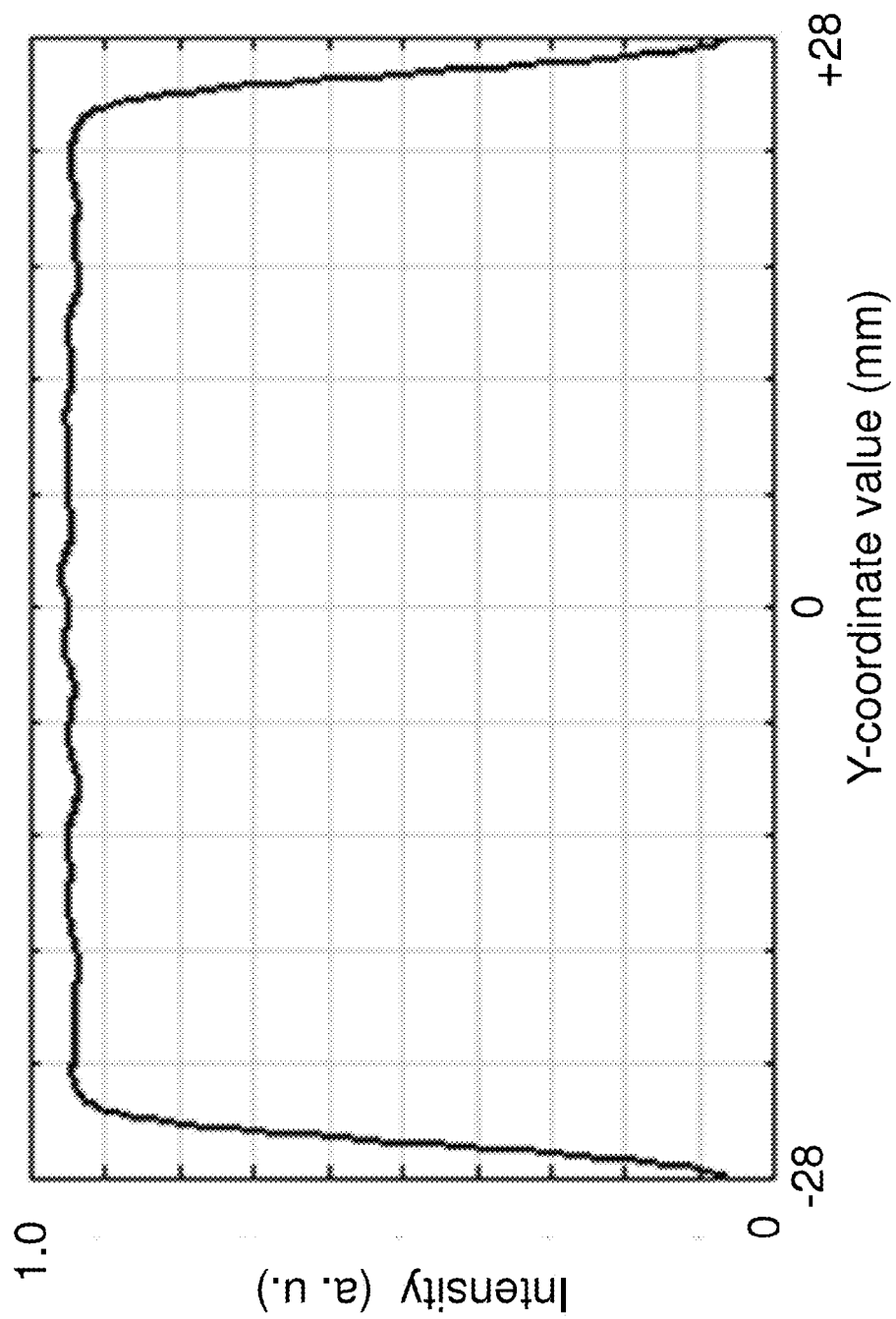
FIG. 8 is a plot of the intensity (arbitrary units) vs. the Y-coordinate (mm) of the light homogenizer rod, illustrating the uniformity of the light emission from the output end of the homogenizer rod based on the data of FIG. 7C.

FIG. 8 is a plot of the Intensity vs. position (Y coordinate value) for output end 454 of homogenizer rod 450 as taken as a Y cross-section of the data of FIG. 7 and confirms excellent illumination uniformity. In an example embodiment, the illumination uniformity of uniformized actinic light 320' at output end 454 of homogenizer rod 450 is within +/−2%.

It is possible to obtain different results by changing the microlens magnification M. For example, if it were desirable to have an output NA of 0.5 from output end 454 of homogenizer rod 450, one could change the microlens magnification to 2.0, and the microlens collecting (object-side) NA to 1.0. The homogenizer rod 450 would then produce a uniform output at output end 454 with the proper NA and size.

The output of homogenizer rod 450 can be modified with relay optical system 470 to match the field size and numerical aperture of the downstream projection imaging system 230. In the earlier example, output end 454 of homogenizer rod 450 is 18 mm×18 mm (324 mm²) and has an NA of 0.3. Let us assume that the desired area and NA is greater than 884 mm² and 0.16, respectively. Using either relay optical system 470, a tapered homogenizer rod 450 or a combination thereof, the source size can be magnified by 1.7× in each direction to get an effective source size of 936 mm², with an NA of 0.176. This effective source slightly overfills projection imaging lens 230, which in fact is more desirable than trying to identically match the projection imaging lens NA.

As noted above, homogenizer rod 450 can be tapered. By replacing the rectangular homogenizer rod 450 discussed in the above example with a tapered homogenizer rod whose entrance aperture is 18 mm×18 mm (324 mm²) and whose output aperture is 30.6 mm×30.6 mm (936 mm²), a source with both the correct field size and the correct NA for the imaging system is created. Hence, the complexity of the illumination system is reduced and its efficiency is enhanced. In some cases, it may be desirable to have a homogenizer rod 450 with an inverse taper, so that the output end cross-sectional area is smaller than that of the input end.

It will be apparent to those skilled in the art that various modifications and variations can be made to the present disclosure without departing from the spirit and scope of the disclosure. Thus it is intended that the present disclosure cover the modifications and variations of this disclosure, provided they fall within the scope of the appended claims and their equivalents.

What is claimed is:

1. An illuminator for a photolithographic system, comprising along an illuminator axis:
   a light source comprising an array of light-emitting diodes (LEDs) arranged generally in a first plane, with each LED having an LED die that radiates actinic light and having an axis and a first area defined by a dimension $L_D$, wherein the LED die is supported by a non-light-radiating heat sink having a second area defined by a dimension $L_H$, with $L_H > L_D$;
   a plurality of microlenses arranged generally in a second plane that is substantially parallel to the first plane, with each microlens having a microlens axis that is generally coaxial with a corresponding one of the LED dies with each microlens having a magnification between 2× and 20×;
   a homogenizer rod having an input end and an output end; and
   wherein each microlens forms on the input end of the homogenizer rod an image of the corresponding LED die to form an array of LED die images that cover substantially the entire input end, thereby defining a plurality of virtual LED light sources on the input end and an illumination uniformity of within +/−2% at the output end.

2. The illuminator of claim 1, wherein the homogenizer rod is tapered.

3. The illuminator of claim 1, wherein the illuminator has a collection efficiency of greater than 50%.

4. The illuminator of claim 3, wherein the illuminator has a collection efficiency of greater than 75%.

5. The illuminator of claim 1, where the each LED emits with a radiance of greater than 600 mW/mm$^2$.

6. The illuminator of claim 1, wherein each microlens in the microlens array has a magnification M that satisfies $(0.5) \cdot L_H/L_D \leq M \leq (1.1) \cdot L_H/L_D$.

7. The illuminator of claim 1, wherein the actinic light has a wavelength between 360 nm and 450 nm.

8. The illuminator of claim 1, wherein the photolithographic system includes a reticle, the illuminator further comprising a relay optical system configured to receive uniformized actinic light from the output end of the homogenizer rod and to illuminate the reticle.

9. An illuminator for a photolithographic system having a projection imaging system with a field size, comprising:
   a light source comprising an array of light-emitting diodes (LEDs) arranged generally in a first plane, with each LED having an LED die that radiates actinic light with a radiance of 600 mW/mm$^2$ and having an axis and a first area defined by a dimension $L_D$, wherein the LED die is supported by a non-light-radiating heat sink having a second area defined by a dimension $L_H$, with $L_H > L_D$;
   a plurality of microlenses arranged generally in a second plane that is substantially parallel to the first plane, with each microlens having a microlens axis that is generally coaxial with a corresponding one of the LED dies, with each microlens having a magnification M that satisfies $(0.5) \cdot L_H/L_D \leq M \leq (1.1) \cdot L_H/L_D$;
   a homogenizer rod having an input end and an output end, wherein the output end substantially matches the field size of the projection imaging system; and
   wherein each microlens forms on the input end of the homogenizer rod an image of the corresponding LED die to form an array of LED die images that cover substantially the entire input end, thereby defining a plurality of virtual LED light sources on the input end and an illumination uniformity of within +/−2% at the output end; and
   wherein the illuminator has a collection efficiency of greater than 50%.

10. The illuminator of claim 9, wherein the collection efficiency is greater than 75%.

11. The illuminator of claim 9, wherein the actinic light has a wavelength between 360 nm and 450 nm.

12. The illuminator of claim 9, wherein the homogenizer rod is tapered, with the output end having a larger area than the input end.

13. The illuminator of claim 9, wherein the photolithographic system includes a reticle, the illuminator further comprising a relay optical system configured to receive uniformized actinic light from the output end of the homogenizer rod and to illuminate the reticle.

* * * * *